(12) United States Patent
Kar et al.

(10) Patent No.: US 11,325,343 B2
(45) Date of Patent: May 10, 2022

(54) ION-DOPED TWO-DIMENSIONAL NANOMATERIALS

(71) Applicant: Northeastern University, Boston, MA (US)

(72) Inventors: Swastik Kar, Belmont, MA (US); Ji Hao, Boston, MA (US); Daniel Rubin, Boston, MA (US); Yung Joon Jung, Lexington, MA (US)

(73) Assignee: Northeastern University, Boston, MA (US)

( * ) Notice: Subject to any disclaimer, the term of this patent is extended or adjusted under 35 U.S.C. 154(b) by 260 days.

(21) Appl. No.: 16/484,024

(22) PCT Filed: Sep. 11, 2017

(86) PCT No.: PCT/US2017/051027
§ 371 (c)(1),
(2) Date: Aug. 6, 2019

(87) PCT Pub. No.: WO2018/144069
PCT Pub. Date: Aug. 9, 2018

(65) Prior Publication Data
US 2020/0094515 A1     Mar. 26, 2020

Related U.S. Application Data

(60) Provisional application No. 62/455,096, filed on Feb. 6, 2017.

(51) Int. Cl.
*B32B 5/16* (2006.01)
*C01B 32/194* (2017.01)
(Continued)

(52) U.S. Cl.
CPC .............. *B32B 5/16* (2013.01); *C01B 32/194* (2017.08); *H01L 29/068* (2013.01);
(Continued)

(58) Field of Classification Search
CPC ......................................... H01L 29/0665–0673
See application file for complete search history.

(56) References Cited

U.S. PATENT DOCUMENTS

2009/0256175 A1* 10/2009 Kim ...................... H01L 51/002
257/213
2012/0128880 A1   5/2012  Talapatra et al.
(Continued)

FOREIGN PATENT DOCUMENTS

CN           106324077 A       1/2017

*Primary Examiner* — Selim U Ahmed
*Assistant Examiner* — Evan G Clinton
(74) *Attorney, Agent, or Firm* — Verrill Dana, LLP

(57) ABSTRACT

Ion-doped two-dimensional nanomaterials are made by inducing electronic carriers (electrons and holes) in a two-dimensional material using a captured ion layer at the surface of the material. The captured ion layer is stabilized using a capping layer. The induction of electronic carriers works in atomically-thin two-dimensional materials, where it induces high carrier density of at least $10^{14}$ carriers/cm$^2$. A variety of novel ion-doped nanomaterials and p-n junction-based nanoelectronic devices are made possible by the method.

12 Claims, 8 Drawing Sheets

(51) Int. Cl.
  *H01L 29/06* (2006.01)
  *B82Y 30/00* (2011.01)
  *B82Y 40/00* (2011.01)

(52) U.S. Cl.
  CPC .......... *H01L 29/0673* (2013.01); *B82Y 30/00* (2013.01); *B82Y 40/00* (2013.01)

(56) References Cited

U.S. PATENT DOCUMENTS

2015/0276677 A1    10/2015  Li et al.
2017/0102358 A1*   4/2017   Hoffman ........... H01L 21/76879

* cited by examiner

ION-DOPED TWO-DIMENSIONAL NANOMATERIALS

CROSS REFERENCE TO RELATED APPLICATIONS

This application claims the priority of U.S. Provisional Appl. No. 62/455,096, filed Feb. 6, 2017, which is hereby incorporated by reference in its entirety.

STATEMENT REGARDING FEDERALLY SPONSORED RESEARCH OR DEVELOPMENT

The invention was developed with financial support from Grant Nos. ECCS 1202376 and DMREF 1434824 from the National Science Foundation. The U.S. Government has certain rights in the invention.

BACKGROUND

Semiconductor materials require doping with chemical elements that promote altered electrical properties, such as the formation of holes and electrons to serve as electrical carriers. The availability of p-type and n-type doping leads to the ability to form p-n junctions, which form the basis of a wide variety of semiconductor devices such as transistors and diodes needed in logic circuits and electronics.

While a wide variety of p-doped and n-doped three-dimensional semiconductor materials are available, newer nanomaterials and the drive to miniaturization have resulted in a variety of two-dimensional semiconductor materials. Doping of two-dimensional materials is more difficult, due to more limited opportunities to fit doping elements into the crystal lattice. Instead, two dimensional materials can be doped using passivation layers which are applied adjacent to the two-dimensional material. However, addition of passivation layers requires complex fabrication techniques, including a number of lithography steps, and the use of harsh conditions, and is also permanent. There is a need for simple, reversible, and adjustable fabrication techniques to create opportunities for doping of two-dimensional materials, and a need for a variety of doped two-dimensional nanomaterials for use in nanoelectronics devices.

SUMMARY OF THE INVENTION

The invention provides new ion-doped two-dimensional nanomaterials and methods for making them. The materials are made by inducing electronic carriers (electrons and holes) in a two-dimensional material using a captured ion layer at the surface of the material. The captured ion layer is preferably stabilized and trapped in place using a capping layer covering the captured ion layer. The induction of electronic carriers works most effectively in atomically-thin, layered, or two-dimensional materials, where it can lead to high density carrier inducement (at least $10^{14}$ carriers/cm$^2$). Methods of the invention also can be used to adjust the optical and electronic properties of nanomaterials in a bias-free, electrode-free, and electrolyte-free method. The invention provides a variety of ion-doped, semiconducting, or conducting two-dimensional nanomaterials and devices containing such materials. The materials can have selectable and tunable carrier concentrations in ultrathin nanomaterials having a thickness as small as a single atomic layer or a small number or atomic layers, or thicker materials having a surface layer enriched in carriers.

One aspect of the invention is an ion-doped nanomaterial. The nanomaterial includes a layer of a two-dimensional material, a layer of captured ions disposed on a surface of the two-dimensional material, and a capping layer disposed above the captured ion layer. The capping layer retains at least a portion of the captured ions adjacent to the surface of the two-dimensional material, and the captured ions stabilize charge carriers in the two-dimensional material. In a preferred embodiment, the material further includes an insulating or semiconducting substrate upon which the two-dimensional material is deposited. In another preferred embodiment, the captured ions are positive ions, and electrons are induced in the two-dimensional nanomaterial, rendering it n-doped. In yet another preferred embodiment, the captured ions are negative ions, and holes are induced in the two-dimensional nanomaterial, rendering it p-doped Another aspect of the invention is a p-n junction containing a p-doped nanomaterial as described above adjacent to an n-doped nanomaterial as described above.

Yet another aspect of the invention is an electronic device comprising the ion-doped nanomaterial or the p-n junction described above. The device can be, for example, a diode, transistor, field-effect transistor, tunneling field effect transistor, photovoltaic device, light-emitting diode, or solar cell.

Still another aspect of the invention is a method of fabricating an ion-doped nanomaterial such as the two-dimensional nanomaterial described above. The method includes the steps of: (a) providing a two-dimensional material layered onto a surface of an insulating or semiconducting substrate, and two conductive pads deposited onto the two-dimensional material with a gap between the conductive pads; (b) exposing a surface of the two-dimensional material opposite to the substrate and between the conductive pads to ions while a voltage is applied between the conductive pads, whereby a portion of the ions are captured on the surface of the two-dimensional material; and (c) applying a capping layer onto the two-dimensional material and above the captured ions to form the ion-doped nanomaterial. In an embodiment of the method, the ions are positive ions and the two-dimensional material becomes n-doped. In another embodiment, the ions are negative ions and the two-dimensional material becomes p-doped.

Another aspect of the invention is a method of fabricating a p-n junction in a two-dimensional material. The method includes the steps of: A method of forming a p-n junction in a two-dimensional material, the method comprising the steps of: (a) providing a two-dimensional material layered onto a surface of an insulating or semiconducting substrate, and two conductive pads deposited onto the two-dimensional material with a gap between the conductive pads; (b) exposing a surface of the two-dimensional material opposite to the substrate and between the conductive pads to ions while a voltage is applied between the conductive pads, whereby a portion of the ions are captured on the surface of the two-dimensional material; (c) applying a capping layer onto a portion of the surface exposed to ions in step (b), and allowing ions to dissipate from the uncapped remainder of the exposed surface; (d) exposing the uncapped portion of said surface to ions of opposite charge to the ions used in step (b) while a voltage is applied between the conductive pads, whereby a portion of the ions of opposite charge are captured on the uncapped surface of the two-dimensional material; and (e) applying a capping layer onto the surface exposed to oppositely charged ions in (d), thereby forming the p-n junction.

The invention can also be summarized by the following listing of embodiments.
1. An ion-doped nanomaterial comprising:
   a layer of a two-dimensional material;
   a layer of captured ions disposed on a surface of the two-dimensional material; and
   a capping layer disposed above the captured ion layer;
   wherein the capping layer retains at least a portion of the captured ions adjacent to the surface of the two-dimensional material; and
   wherein the captured ions stabilize charge carriers in the two-dimensional material.
2. The ion-doped nanomaterial of embodiment 1, wherein the two-dimensional material comprises graphene or carbon nanotubes.
3. The ion-doped nanomaterial of embodiment 1, wherein the two-dimensional material comprises a material selected from the group consisting of GaS, GaSe, InS, InSe, $HfS_2$, $HfSe_2$, $HfTe_2$, $MoS_2$, $MoSe_2$, $MoTe_2$, $NbS_2$, $NbSe_2$, $NbTe_2$, $NiS_2$, $NiSe_2$, $NiTe_2$, $PdS_2$, $PdSe_2$, $PdTe_2$, $PtS_2$, $PtSe_2$, $PtTe_2$, $ReS_2$, $ReSe_2$, $ReTe_2$, $TaS_2$, $TaSe_2$, $TaTe_2$, $TiS_2$, $TiSe_2$, $TiTe_2$, $WS_2$, $WSe_2$, $WTe_2$, $ZrS_2$, $ZrSe_2$, and $ZrTe_2$.
4. The ion-doped nanomaterial of any of the preceding embodiments, wherein the two-dimensional material has a thickness in the range from one atomic layer to about 10 atomic layers.
5. The ion-doped nanomaterial of any of the preceding embodiments, wherein the captured ions are positive ions, and holes are induced in the two-dimensional nanomaterial, rendering it p-doped.
6. The ion-doped nanomaterial of embodiment 5, wherein the positive ions are selected from the group consisting of $N_2^+$, $N^+$, $O_2^+$, and $Ar^+$.
7. The ion-doped nanomaterial of any of embodiments 1-4, wherein the captured ions are negative ions, and free electrons are induced in the two-dimensional nanomaterial, rendering it n-doped.
8. The ion-doped nanomaterial of embodiment 7, wherein the negative ions are selected from the group consisting of $N_2^-$, $O_2^-$, and $CO_3^-$.
9. The ion-doped nanomaterial of any of the preceding embodiments having a carrier density of at least $1 \times 10^{14}$ $cm^{-2}$.
10. The ion-doped nanomaterial of any of the preceding embodiments, further comprising an insulating or semiconducting substrate upon which the two-dimensional material is deposited, wherein the two-dimensional material contacts the substrate at a surface opposite to the surface on which the captured ions are disposed.
11. The ion-doped nanomaterial of embodiment 10, wherein the substrate comprises or consists of silicon, silicon dioxide, a layer of silicon dioxide disposed over a layer of silicon, or an organic polymer.
12. The ion-doped nanomaterial of any of the preceding embodiments, wherein the capping layer comprises a material selected from the group consisting of polydimethylsiloxane (PDMS), poly(methyl methacrylate) (PMMA), or a photoresist.
13. The ion-doped nanomaterial of any of the preceding embodiments, wherein the thickness of the capping layer is in the range from about 100 nm to about 100 µm.
14. A p-n junction comprising the p-doped nanomaterial of embodiment 5 adjacent to the n-doped nanomaterial of embodiment 7, forming a p-n junction between the p-doped and n-doped nanomaterials.
15. An electronic device comprising the ion-doped nanomaterial of any of embodiments 1-13, or the p-n junction of embodiment 14.
16. The device of embodiment 15 which is a diode, transistor, field-effect transistor, tunneling field effect transistor, photovoltaic device, light-emitting diode, or solar cell.
17. A method of fabricating an ion-doped nanomaterial, the method comprising the steps of:
   (a) providing a two-dimensional material layered onto a surface of an insulating or semiconducting substrate, and two conductive pads deposited onto the two-dimensional material with a gap between the conductive pads;
   (b) exposing a surface of the two-dimensional material opposite to the substrate and between the conductive pads to ions while a voltage is applied between the conductive pads, whereby a portion of the ions are captured on the surface of the two-dimensional material; and
   (c) applying a capping layer onto the two-dimensional material and above the captured ions to form the ion-doped nanomaterial.
18. The method of embodiment 17, wherein the ions are positive ions and the two-dimensional material becomes n-doped.
19. The method of embodiment 17, wherein the ions are negative ions and the two dimensional material becomes p-doped.
20. The method of any of embodiments 17-19, wherein the voltage applied in step (b) in in the range from about 0.1 to about 10 volts.
21. The method of any of embodiments 17-20, wherein current flow in the two-dimensional material is measured in step (b) to monitor the capture of ions.
22. The method of any of embodiments 17-21, wherein step (c) is performed under vacuum.
23. The method of any of embodiments 17-22, wherein step (c) comprises transfer of a pre-formed film of insulating material onto the area of ion capture from step (b).
24. A method of forming a p-n junction in a two-dimensional material, the method comprising the steps of:
   (a) providing a two-dimensional material layered onto a surface of an insulating or semiconducting substrate, and two conductive pads deposited onto the two-dimensional material with a gap between the conductive pads;
   (b) exposing a surface of the two-dimensional material opposite to the substrate and between the conductive pads to ions while a voltage is applied between the conductive pads, whereby a portion of the ions are captured on the surface of the two-dimensional material; and
   (c) applying a capping layer onto a portion of the surface exposed to ions in step (b), and allowing ions to dissipate from the uncapped remainder of the exposed surface;
   (d) exposing the uncapped portion of said surface to ions of opposite charge to the ions used in step (b) while a voltage is applied between the conductive pads, whereby a portion of the ions of opposite charge are captured on the uncapped surface of the two-dimensional material; and
   (e) applying a capping layer onto the surface exposed to oppositely charged ions in (d), thereby forming the p-n junction.

BRIEF DESCRIPTION OF THE DRAWINGS

FIG. 2A is an optical image of the device tested. FIG. 2B is a schematic illustration of a 3-terminal graphene FET device with incident positive ions (mostly $N_2^+$). The expanded lower section depicts ion capture at the graphene surface. FIG. 2C shows shifting of gate-modulated channel-conductance as a function of the elapsed time of ion-dosing, indicating the induction of n-type carriers by vapor phase ion gating. FIG. 2D shows variation of electron (lower curve) and hole (upper curve) mobility in graphene as a function of ion incidence, showing no degradation with ion attachment.

FIG. 3A is an optical image (plan view) of the molybdenum disulfide monolayer (triangular portion) deposited on a silicon dioxide-coated silicon substrate. FIG. 3B shows a schematic illustration (perspective view) of a transistor device containing the molybdenum disulfide layer and substrate of FIG. 3A and three metallic contacts forming the source, drain, and gate; ions incident on the device from above are also depicted. FIG. 3C shows that the transfer characteristics of the device shift to the left under positive ion incidence, indicating the induction of n-type carriers in the $MoS_2$ monolayer; the dashed arrow shows the shift from right to left with increasing exposure to positive ions. FIG. 3D shows a shift to the right (dashed arrow pointing down and to the right) under negative ion incidence, indicating the induction of p-type carriers in the $MoS_2$ monolayer; recovery after removal of the ions for one day is shown as the dashed curve and dashed arrow pointing upward and to the left.

FIG. 3E shows the variation of the magnitude of induced carrier density $\Delta n$ with increasing positive ion-incidence. Larger values of $\Delta n$ beyond this value could not be estimated using the field effect formula, and would require Hall-effect measurements.

FIG. 4A shows an optical image of a two-terminal device using a film of single-walled carbon nanotubes (SWNT). FIG. 4B shows a schematic illustration of ion capture by the device. FIG. 4C shows the typical variation of source-drain current under a 2-minute dose of positive ions, and immediate recovery when the source is switched off. Recovery after 1 day and 4 days (overlapping lower traces) is shown in the lower left quadrant of the figure, and the result after capping is shown as the upper trace in the lower left quadrant. FIG. 4D schematically shows a process of capping the device with a PDMS film after ion capture to arrest the recovery. FIG. 4E shows percentage recovery in uncapped (bars 1, 2, and 6 from left) and capped devices (bars 3, 4, and 5 from left) when left under vacuum or exposed to "open-air" conditions. Devices did not "recover" further (cyan and magenta compared to blue) after capping for up to 4 days when capped, and recovered again when capping was removed (bar 6 from left). The last bar (7 from left) shows that bare PDMS had a negligible impact on channel current (measured as a percentage of typical current change after 2-min exposure).

DETAILED DESCRIPTION OF THE INVENTION

The invention provides novel nanomaterials that are ion-doped at a surface and contain a high density of charge carriers (electrons and holes) beneath the ion doped surface. The materials can be two-dimensional and as thin as a single atomic monolayer. The ion doping layer can be added and removed without altering the properties of the underlying material, or a captured ion layer can be fixed in place semi-permanently by applying a capping layer of insulating material. The induction of electronic carriers works most effectively in atomically-thin, layered, or two-dimensional materials, where it can lead to high density carrier inducement (at least $10^{14}$ carriers/cm$^2$).

In some embodiments, methods of the invention utilize the alteration of current through a two-dimensional material or ultrathin layer of a semiconducting or other material when a voltage is applied across the material and ions bind to the material. Such effects have been applied to ultrasensitive ion sensing devices utilizing carbon nanomaterials such as graphene and carbon nanotubes (see, e.g., WO2014/075064]. In other embodiments, methods of the invention also can be used to adjust the optical and electronic properties of nanomaterials in a bias-free, electrode-free, and electrolyte-free manner, simply by altering their exposure to ions.

A variety of novel ion-doped materials are made possible by the present invention. The materials have selectable carriers, resulting in either p-type or n-type doping, and tunable carrier concentrations. For the first time, the invention makes possible the stable induction of carriers in ultrathin nanomaterials, such as materials having a thickness as small as a single atomic layer (i.e., monolayers) or a small number or atomic layers (e.g., from 1 to about 10, 1 to about 9, 1 to about 8, 1 to about 7, 1 to about 6, 1 to about 5, 1 to about 4, 1 to about 3, or 1 to 2 atomic layers), composites of 2 or more layers of such materials, or thicker materials for which a surface layer enriched in carriers is desired.

Figure 1:
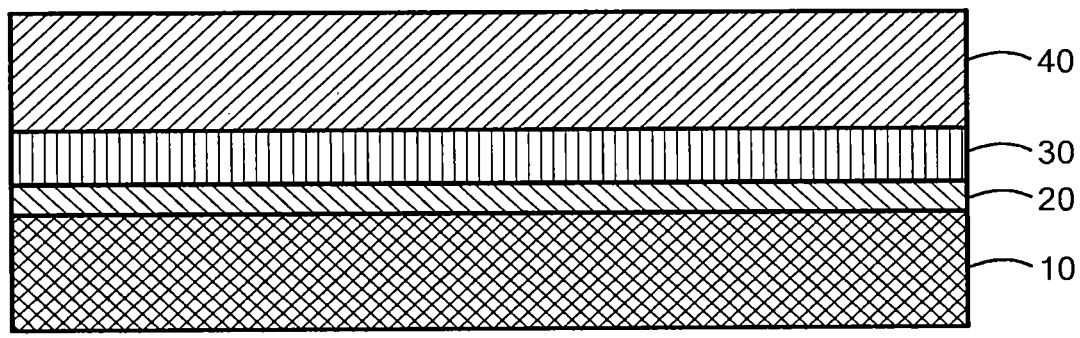
FIG. 1 is a schematic illustration of a cross-sectional view of an ion-doped two-dimensional nanomaterial according to the invention.
Figure 2A:
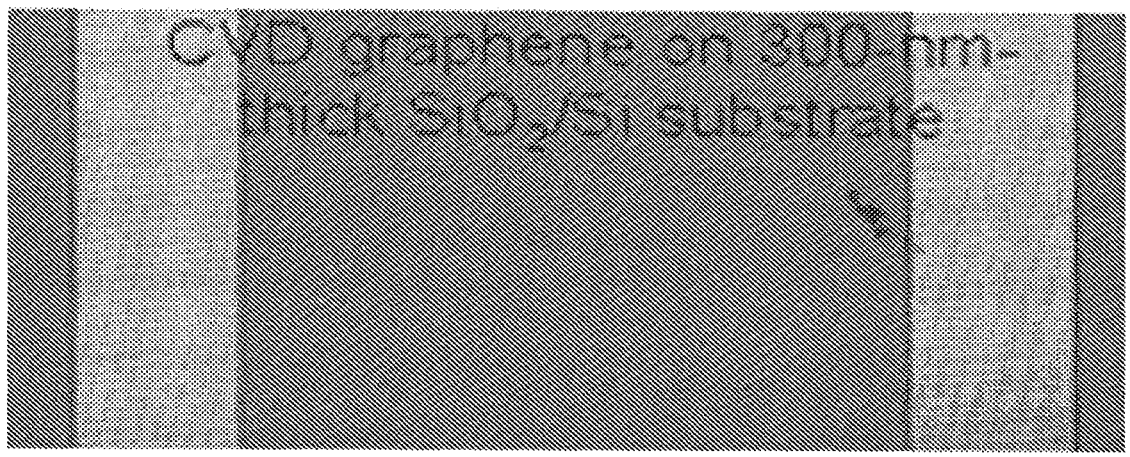
FIGS. 2A-2D show ion capture and carrier induction in graphene.
Figure 2B:
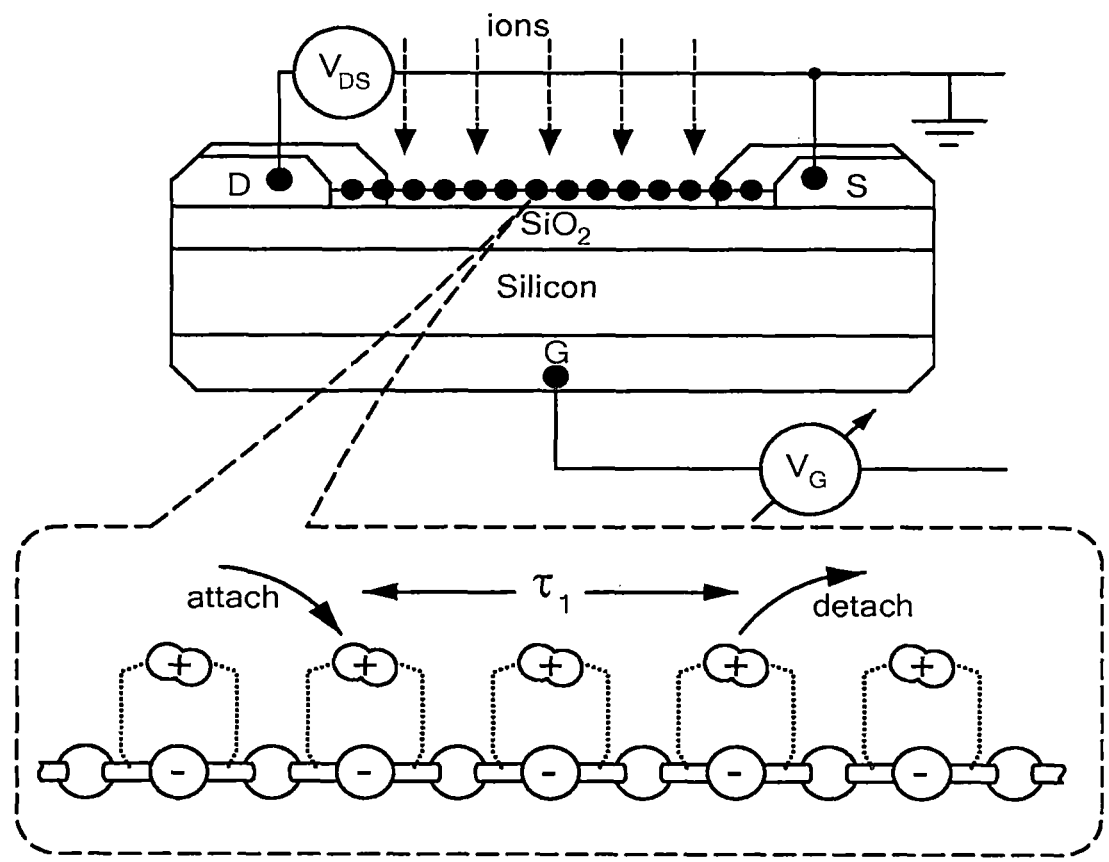
Figure 2C:
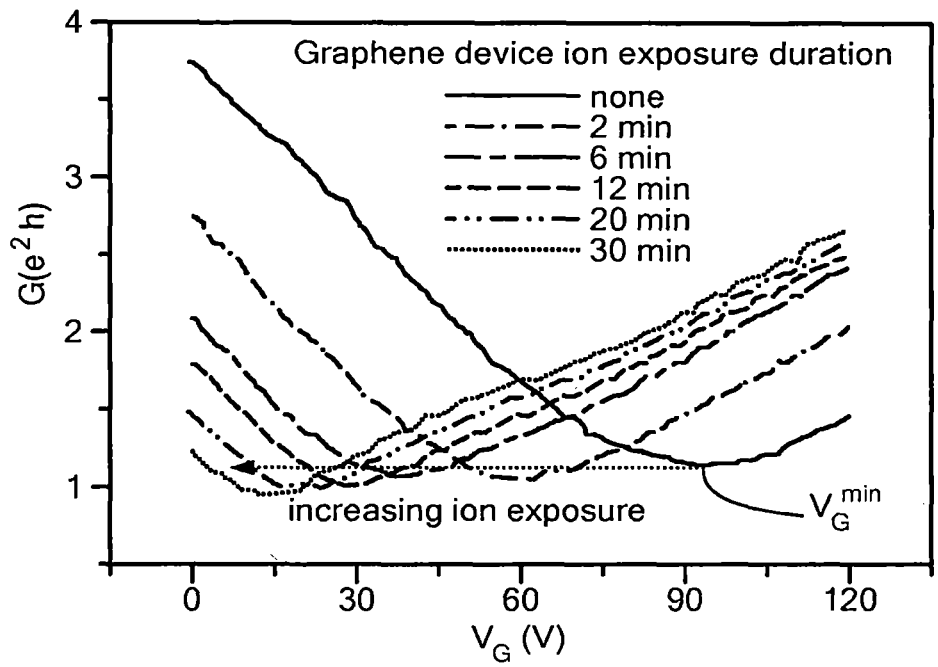
Figure 2D:
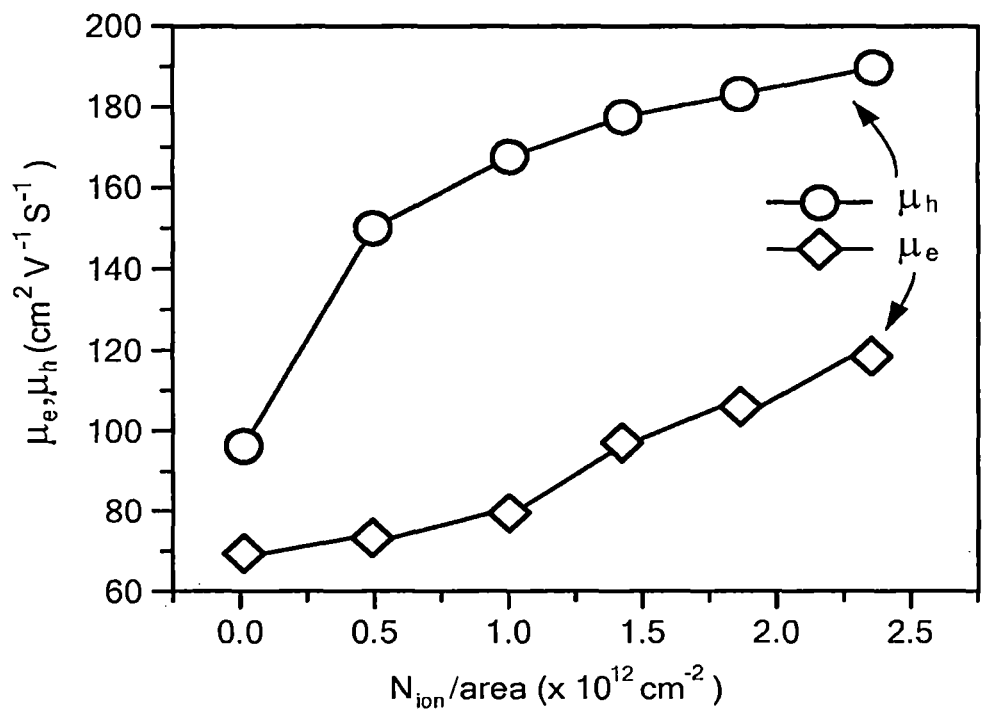

FIG. 1 shows a schematic representation of an ion-doped nanomaterial 5 of the invention. The device contains substrate layer 10; two-dimensional material layer 20 deposited onto a surface of the substrate; captured ion layer 30 deposited onto the two-dimensional material layer on a surface opposite to the surface contacting the substrate; and optionally capping layer 40 deposited over the captured ion layer and trapping the ions in position against the two-dimensional material. The relative dimensions shown in the figure, including the relative thicknesses of the component layers, are arbitrary and are not intended to represent relative dimensions of an actual material or device.

Substrate 10 can contain or be made entirely of an insulating or semiconducting material, such as silicon or another semiconductor material (e.g., germanium, silicon nitride, or another III-V material), silicon dioxide, or of one or more non-conductive polymers or co-polymers, including polydimethylsilane (PDMS), photoresists such as SU-8, poly(methyl methacrylate) (PMMA), or any combination, blend, or layering thereof. The substrate is preferably planar, at least in part, or has a planar surface; however, the substrate can have a three-dimensional form or can conform to a three dimensional shape. The substrate can be part of a microelectronic or nanoelectronic device or component of a device.

Two-dimensional material layer 20 is preferably a single atomic layer (monolayer) of a two-dimensional (2D) material, such as graphene, GaS, GaSe, InS, InSe, $HfS_2$, $HfSe_2$, $HfTe_2$, $MoS_2$, $MoSe_2$, $MoTe_2$, $NbS_2$, $NbSe_2$, $NbTe_2$, $NiS_2$, $NiSe_2$, $NiTe_2$, $PdS_2$, $PdSe_2$, $PdTe_2$, $PtS_2$, $PtSe_2$, $PtTe_2$, $ReS_2$, $ReSe_2$, $ReTe_2$, $TaS_2$, $TaSe_2$, $TaTe_2$, $TiS_2$, $TiSe_2$, $TiTe_2$, $WS_2$, $WSe_2$, $WTe_2$, $ZrS_2$, $ZrSe_2$, and $ZrTe_2$. Two or more atomic layers of such materials also can be used. Other forms of carbon nanomaterials also can be used if deposited to form an ultrathin layer, such as single-walled carbon nanotubes, multi-walled carbon nanotubes, carbon nanoribbons, and the like. In general, the two-dimensional material has a crystalline or highly ordered atomic structure in two dimensions, and is not an amorphous material at the atomic level. The two-dimensional material layer is ultrathin (preferably a single atomic layer, or a few atomic layers, in thickness) and forms an essentially planar surface, which may be either flat or conform to a three-dimensional shape (e.g., a shape determined by the substrate). The thickness of the two-dimensional material layer preferably is in the range from less than 1 nm (e.g., a single atomic diameter) to about 1, about 2, about 3, about 5, about 10, or about 20 nm. In certain embodiments, the two-dimensional layer is much thicker (for example in the micron range or mm range), and only a thin surface layer of the material will be affected by ion doping of the surface. The two-dimensional material also has the property of supporting the stable presence, under suitable conditions of ion doping, of charge carriers (holes or electrons) within its lattice. The two-dimensional material layer can be deposited onto the substrate by any known chemical or physical method, such as chemical vapor deposition, or a physical deposition method, such as sputtering or atomic layer deposition. Optionally, the two-dimensional material can be subjected to annealing, for example, at high temperatures, or other methods, so as to remove defects in the atomic lattice of the material. The two-dimensional material can cover all or only a part of the substrate.

Optionally, one or more electrical contacts can be deposited onto or below the two-dimensional material, for the application of bias across the plane or across the thickness of the two-dimensional material. Deposition of contacts can be achieved by depositing a conductive metal, such as gold, silver, copper, aluminum, chromium, or an alloy thereof, at the desired location on the two-dimensional material or on the substrate. Such electrical contact pads also can be deposited on the underside of the substrate (i.e., the side facing away from the two-dimensional material).

Captured ion layer 30 is disposed on and contacts the surface of the two-dimensional layer opposite the substrate. The ions can be any positive or negative ions of any charge and any chemical composition. Examples of positive ions readily generated from air are $N_2^+$, $N^+$, $O_2^+$, and $Ar^+$, and examples of negative ions Ions can be generated and captured in air, at reduced pressure, or under vacuum. Generally, the ions will be either all positive or all negative, although mixtures of positive and negative ions also can be used, as long a there is a majority of either type. Ions can be captured at any exposed surface of the two-dimensional material by any known method. A preferred method is to apply a voltage across a portion of the two-dimensional material, e.g., between two conductive pads contacting the two-dimensional material; however, ions will interact with two-dimensional materials even without application of a bias to the material. The accumulation of ions at the surface of the 2D material can be tracked by measuring the induction of charge carriers (holes or electrons) in the material, which can be derived from the current flowing through the material under applied voltage, as shown below in the Examples. Ions within the captured ion layer generally do not form chemical interactions (i.e., ionic or covalent bonds) with one another or with the two-dimensional material.

Capping layer 40 is optional but highly preferred, as it stabilizes and maintains the captured ion layer and eliminates the need for continued presence of an ion source to maintain ion doping of the two-dimensional material. The capping layer is formed of an insulating material, such as an uncharged polymer (e.g., polydimethylsilane (PDMS), poly (methyl methacrylate) (PMMA), or a photoresist, or any uncharged dielectric material capable of forming a mechanically stable thin film capable of mechanical transfer. The capping layer can be deposited onto the captured ion by any known method, including chemical vapor deposition or physical deposition, or mechanical transfer (e.g., using manual transfer by forceps, or transfer using a micromanipulator). A preferred method is mechanical transfer of the capping layer onto the ion-doped surface of the two-dimensional material, because it can be performed quickly and without harsh conditions (such as exposure to high temperature or highly reactive chemicals) so as to avoid loss of the captured ions during the process. The capping layer can be of any suitable thickness, but preferably has a thickness in the range from about 10 nm to several microns, such as from about 10 nm to about 1 micron, or about 10 nm to about 10 microns, or from about 10 nm to about 100 microns or more, or from about 100 nm to about 1 mm. By applying a capping layer the ion doping effect of the two-dimensional material can be maintained for at least 1, 2, 3, 4, 5, 6, or 7 days or longer, such as indefinitely. Other than stabilization of the captured ion layer, the application of a capping layer has little or no effect on the chemical or physical (e.g., electrical) properties of the coated two-dimensional material. The capping layer can be reversably bound to the two-dimensional material layer. When the capping layer is removed, the captured ions will diffuse away, restoring the two-dimensional material to its original state.

The methods of the invention have a number of advantages for providing ion capture and ion doping of two-dimensional materials. Conventional methods require constructing a passivation layer, which involves complex and time-consuming lithography methods, and is difficult to reverse or repeat on the same material. However, with the present invention, after removal of the capping film, the captured ions will release, and the two-dimensional material can be exposed again to ions to repeat or vary the process. In the present methods, a capping layer can be rapidly and selectively applied to desired areas without the need for a masking process or harsh conditions required for chemical vapor deposition. The capped ion layer is stable for long periods of time. Further, the methods of the present invention allow the electrical properties of two-dimensional materials to be adjusted and adapted by altering the ion type and density, which will facilitate the development of new devices, such as devices including p-n junctions such as tunneling field effect devices and the like. For example, a p-n junction can be fabricated by first exposing an area to positive ions, resulting in n-type doping. The region can be partially capped, after which ions will disperse from the uncapped portion. The uncapped portion can then be exposed to negative ions and capped, rendering it p-type and forming a p-n junction. Compared to typical MOSFET devices, tunneling field effect devices made using the present methods are expected to have faster speed, lower energy consumption, and a simpler structure (e.g., will not require split-gate configurations like MOSFET devices). Devices that can incorporate p-n junctions made using methods of the invention also include light-emitting diodes (LEDs), photovoltaic devices, optical sensors, and solar cells.

EXAMPLES

Example 1

Ion-Based Gating of Graphene.

Ion-exposure experiments were performed on a variety of nanomaterials, both under vacuum (P~$10^{-5}$ Torr, using Granville Phillips Ionization Gauge Model No. 274003, producing primarily $N_2^+$) as well as in open air (Ion Projector Model No. NIP-6E), the generated ion flux was directed from the ionization gauge towards the device); both conditions were found to be equally effective. FIGS. 2A-2D outline the results of ion-incidence experiments on a gated, 3-terminal graphene device (shown in FIGS. 2A, 2B), in which the metal-graphene contact area was covered with a photoresist layer to eliminate any contact-induced effect.

If the incident positive ions were to absorb electrons from graphene, they would induce holes (i.e. p-type doping) that should right-shift the transconductance curves towards higher positive values. In contrast (FIG. 2C), starting with an intrinsically p-doped device, the exposure to incident positive ions led to the curves being left-shifted towards lower positive values, indicating an n-type doping. This result can be explained if the incident ions, instead of doping the graphene sheet, induce electrostatically-gated n-type carriers within the graphene (as depicted in the bubbled portion of FIG. 2B). Such induction is known in electrochemical gating in liquids, where ionic species can form an electrostatic double-layer gate at very close proximities. The field-effect mobility did not degrade (FIG. 2D) upon ion-attachment, indicating that the ions were not acting as scattering sites. There was no significant vertical shift or change in the curve shapes, implying that effects of local field induced opening up of gaps in the density of states was negligible.

Example 2

Ion-Based Gating of Molybdenum Disulfide in an FET Device.

Figures 3A, 3B:
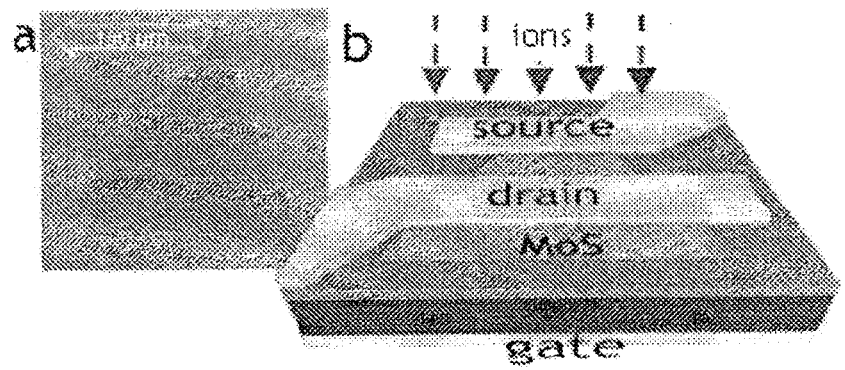
FIGS. 3A-3E show ion capture and carrier induction in a molybdenum disulfide monolayer {$MoS_2$}.
Figure 3C:
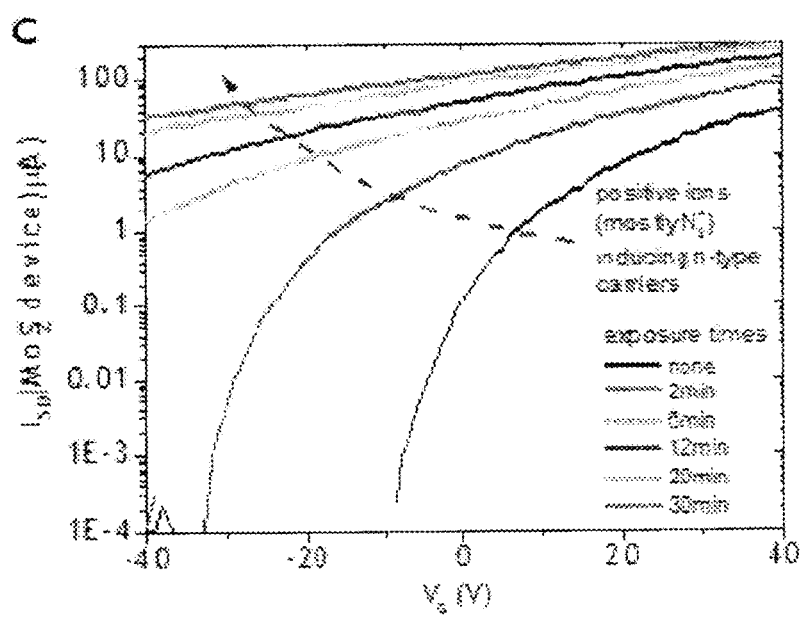
Figure 3D:
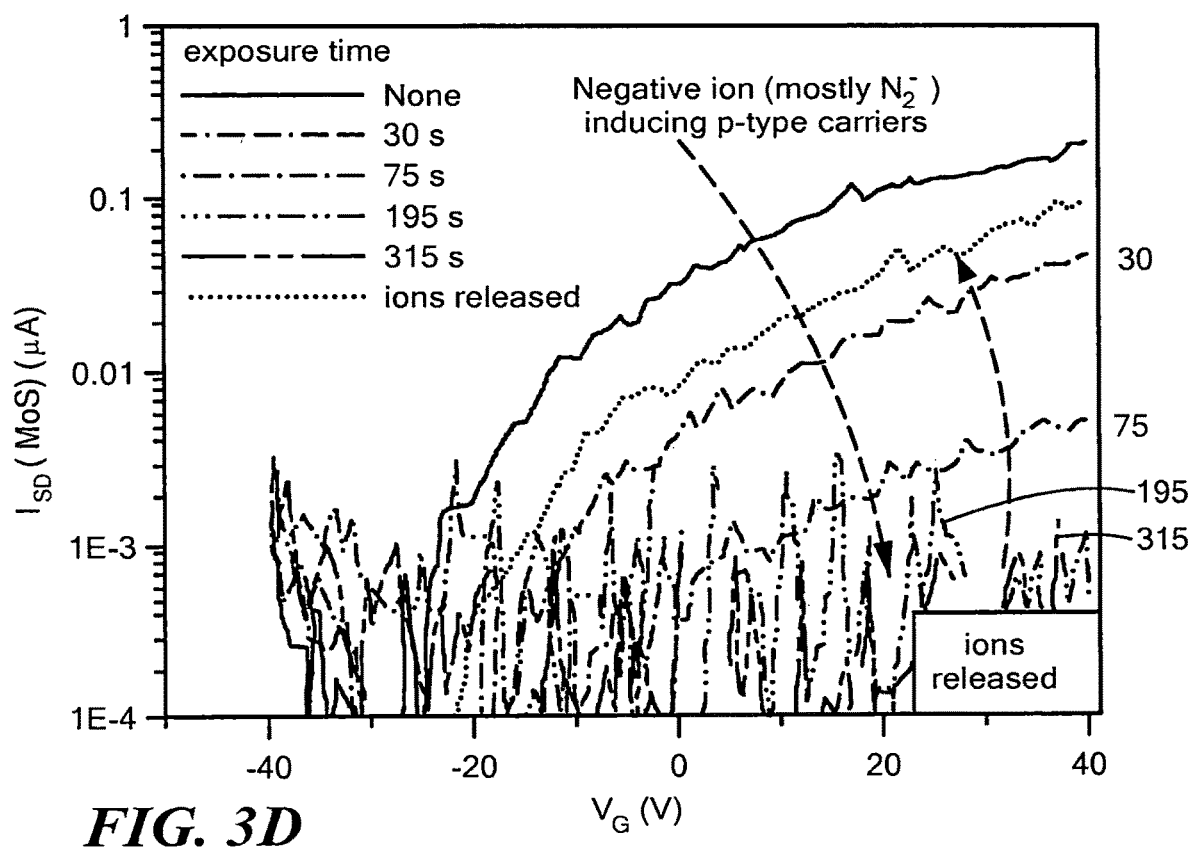
Figure 3E:
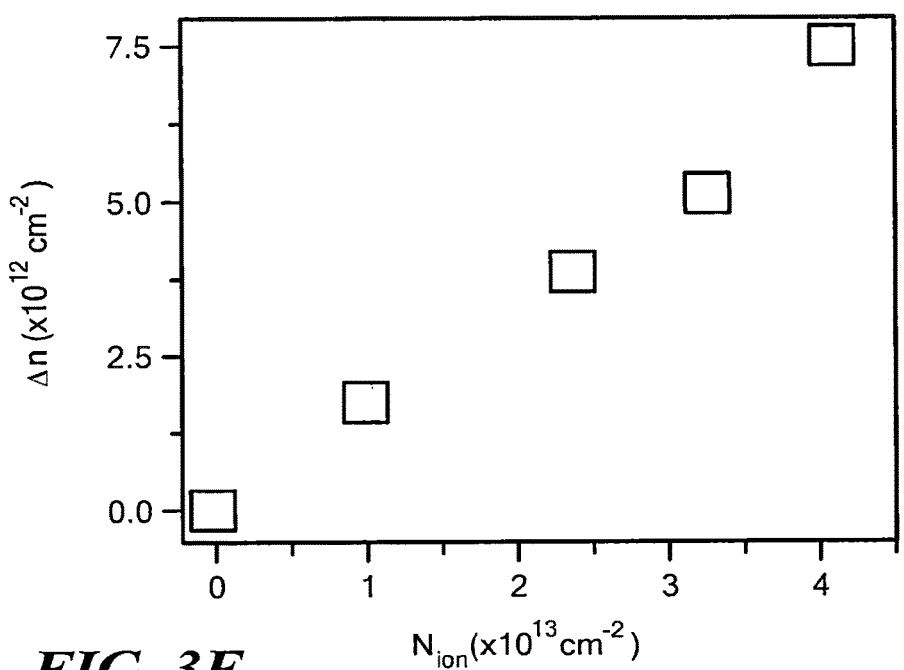

FIGS. 3A-3E summarize an experiment similar to Example 1 but performed on a monolayer $MoS_2$ FET device. A monolayer of atomically thin $MoS_2$ was made by chemical vapor deposition, resulting in an optoelectronic grade crystalline quality film. WO2016/133570 describes methods of making ultrathin $MoS_2$ films. As in the previous case, the contact areas were protected with photoresist prior to ion-exposure. In this study, the devices were tested with both positive and negative ions. Different devices were used to eliminate any "history" effect. FIGS. 3C and 3D show how the transfer characteristics shifted to the left (indicating n-type doping in case of positive ions) and to the right (indicating p-type doping in case of negative ions). The transfer curves recovered (as seen in FIG. 3D) after overnight release, indicating that the ions did not form any chemical bonds. The induced carrier density was estimated using the formula $\Delta n_{2D} = C_{ox}\{V_{th}(N_{ion}) - V_{th}(N_{ion}=0)\}/e$ where $C_{ox}$=gate capacitance per unit area, e is the magnitude of electronic charge, and $V_{th}$ was assigned as the gate voltage where the channel current was≈background noise current (onset of OFF state). FIG. 3E shows the variation of (the magnitude of) $\Delta n_{2D}$ with increased dosage ($N_{ion}$) was measured using a Faraday cup. Measurements could only be performed up to $\Delta n_{2D} \approx 7.5 \times 10^{12}$ cm$^{-2}$, beyond which the device current was too large and didn't show any OFF state within reasonable back-gate voltages. However, the channel current continued to grow without saturation, suggesting that induction of much higher carrier densities is possible. Similar carrier densities could also be obtained for p-type doping (not shown).

Example 3

Stabilization of Ion-Doping by Addition of a Capping Layer.

Carrier-induction as demonstrated in Examples 1 and 2 remained effective as long as the ion source remained on, and stable doping levels could be achieved by controlling the source rate once the desired doping level had been achieved. However, while this approach was quite effective for investigating a variety of fundamental questions, for practical applications the doping effect must be stabilized.

Figures 4A, 4B:
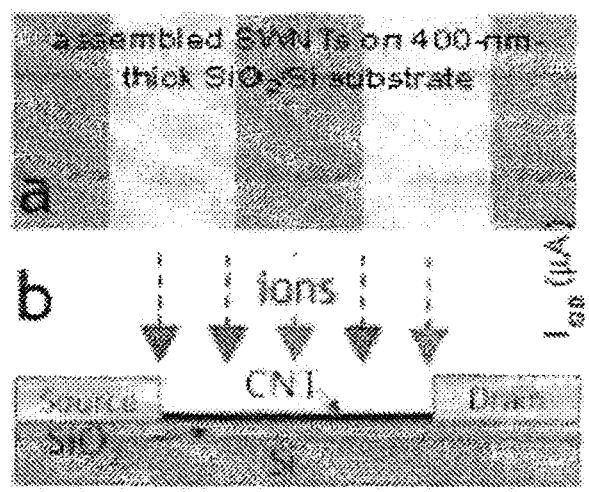
FIGS. 4A-4E depict an experiment demonstrating the stabilization of a captured ion layer using a capping layer.
Figure 4C:
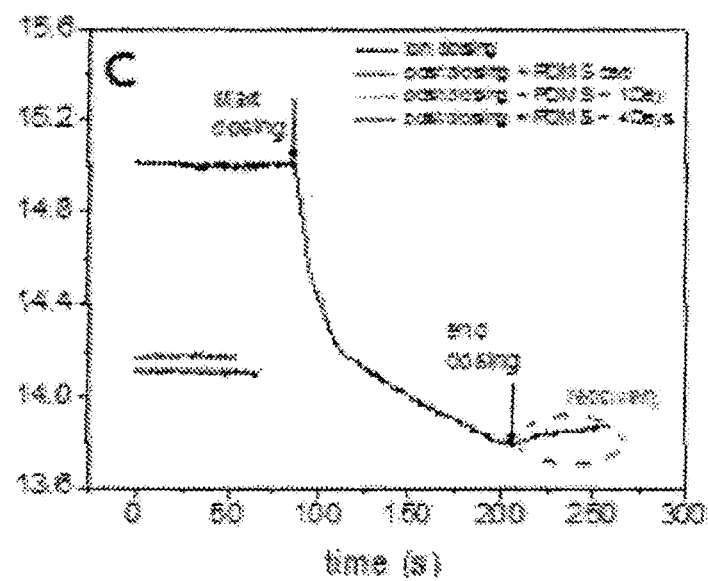
Figure 4D:
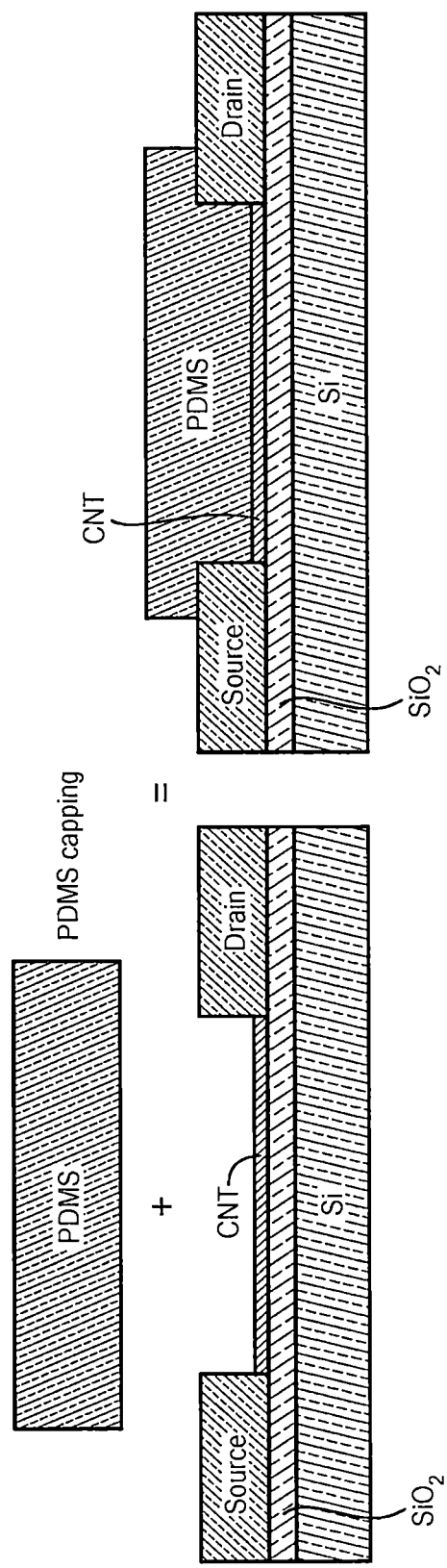
Figure 4E:
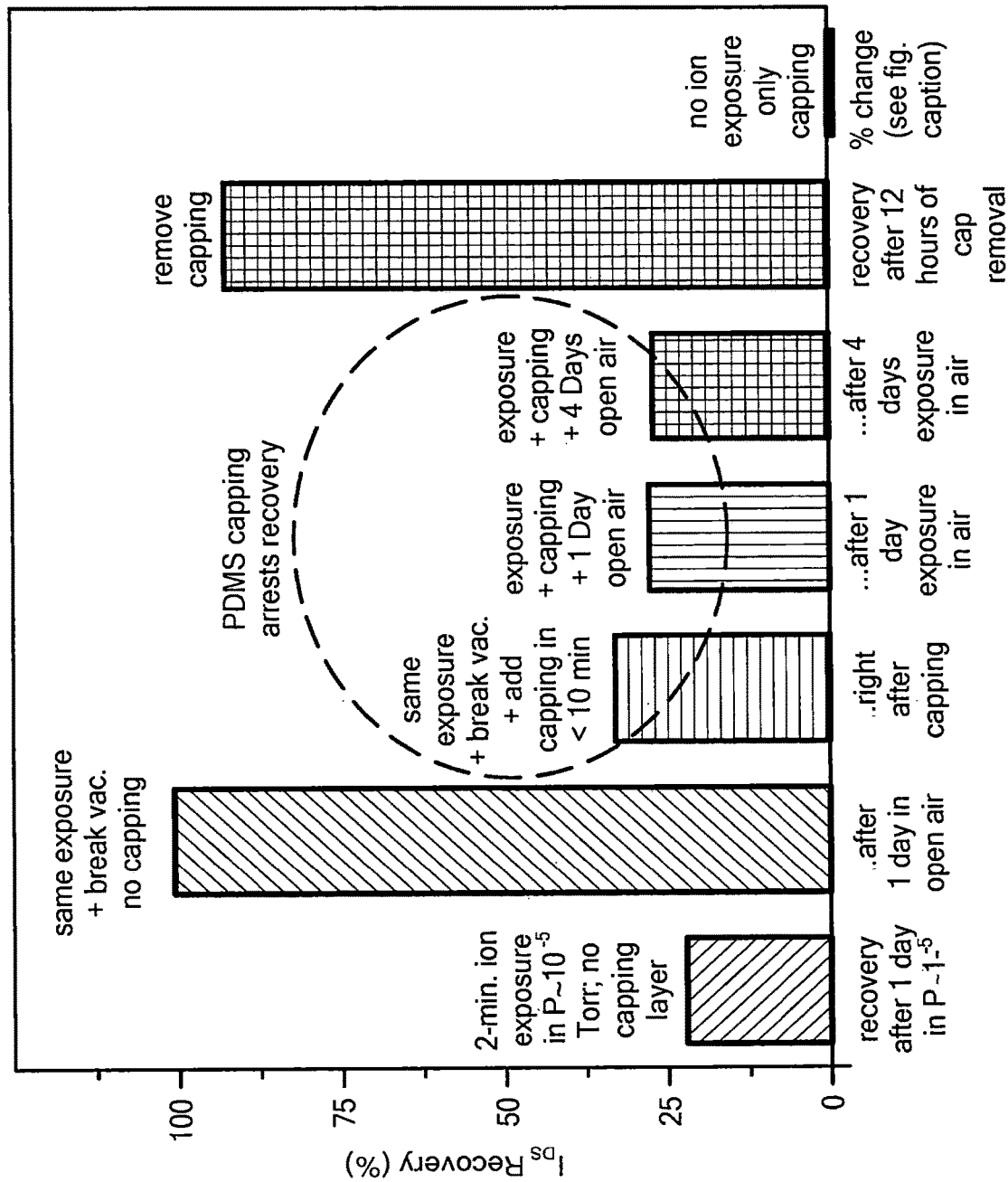

Devices were capped with a freshly cured insulating polydimethylsiloxane (PDMS) thin film. FIGS. 4A-4E summarize the experimental results obtained where the release and recovery of the channel current in a set of devices using a single-wall carbon nanotube (SWNT) film; the devices were of similar geometry and resistance. The devices (shown in FIGS. 4A, 4B) were studied under various pressure and capping conditions over several days. In all devices, the channel current was monitored under a fixed bias (0.2V) after 2 mins of ion exposure from a positive ion source (FIG. 4C). Once the source was switched off, the recovery was also monitored as a function of time.

In uncapped devices, while a large portion of the attached ions (over 75%) remained attached under vacuum even after 1 day, total recovery was achieved in ambient air within a day, indicating that neutralization of the ions took place from the ambient air and not the underlying nanomaterial. In another set of experiments, the devices were exposed to ions, and then a thin PDMS film was mechanically placed on the active area. The devices were then placed in vacuum. The recovery level during this process was a found to be a little over 25%. When those capped devices were brought back to open air and allowed to sit in air for up to 4 days, no further recovery was noticed, suggesting that capping provided long-term stability of ion doping using appropriate insulating caps and transfer performed under complete vacuum. Upon removal of the PDMS film and exposure to open air, the devices started to recover again as before, recovering ~93% within 12 hrs. The bare PDMS capping layer had little effect on the channel conductance.

As used herein, "consisting essentially of" allows the inclusion of materials or steps that do not materially affect the basic and novel characteristics of the claim. Any recitation herein of the term "comprising", particularly in a description of components of a composition or in a description of elements of a device, can be exchanged with "consisting essentially of" or "consisting of".

From the above description, one skilled in the art can easily ascertain the essential characteristics of the present invention, and without departing from the spirit and scope thereof, can make various changes and modifications of the invention to adapt it to various usages and conditions. Thus, other embodiments are also within the scope of the following claims.

What is claimed is:

1. An ion-doped nanomaterial comprising:
   a layer of a two-dimensional material;
   a layer of captured ions disposed on a surface of the two-dimensional material, wherein the captured ions are positive ions selected from the group consisting of $N_2^{3+}$, $N^+$, $O_2^+$, and $Ar^+$, and electrons are induced in the two-dimensional nanomaterial, rendering it n-doped, or wherein the captured ions are negative ions selected from the group consisting of $N_2^-$, $O_2^-$, and $CO_3^-$, and holes are induced in the two-dimensional nanomaterial, rendering it p-doped; and a capping layer disposed above the captured ion layer;

wherein the capping layer retains at least a portion of the captured ions adjacent to the surface of the two-dimensional material; and wherein the captured ions stabilize charge carriers in the two-dimensional material.

2. The ion-doped nanomaterial of claim 1, wherein the two-dimensional material comprises graphene or carbon nanotubes.

3. The ion-doped nanomaterial of claim 1, wherein the two-dimensional material comprises a material selected from the group consisting of GaS, GaSe, InS, InSe, $HfS_2$, $HfSe_2$, $HfTe_2$, $MoS_2$, $MoSe_2$, $MoTe_2$, $NbS_2$, $NbSe_2$, $NbTe_2$, $NiS_2$, $NiSe_2$, $NiTe_2$, $PdS_2$, $PdSe_2$, $PdTe_2$, $PtS_2$, $PtSe_2$, $PtTe_2$, $ReS_2$, $ReSe_2$, $ReTe_2$, $TaS_2$, $TaSe_2$, $TaTe_2$, $TiS_2$, $TiSe_2$, $TiTe_2$, $WS_2$, $WSe_2$, $WTe_2$, $ZrS_2$, $ZrSe_2$, and $ZrTe_2$.

4. The ion-doped nanomaterial of claim 1, wherein the two-dimensional material has a thickness in the range from one atomic layer to about 10 atomic layers.

5. The ion-doped nanomaterial of claim 1 having a carrier density of at least $1\times10^{14}$ $cm^{-2}$.

6. The ion-doped nanomaterial of claim 1, further comprising an insulating or semiconducting substrate upon which the two-dimensional material is deposited, wherein the two-dimensional material contacts the substrate at a surface opposite to the surface on which the captured ions are disposed.

7. The ion-doped nanomaterial of claim 6, wherein the substrate comprises or consists of silicon, silicon dioxide, a layer of silicon dioxide disposed over a layer of silicon, or an organic polymer.

8. The ion-doped nanomaterial of claim 1, wherein the capping layer comprises a material selected from the group consisting of polydimethylsiloxane (PDMS), poly(methyl methacrylate) (PMMA), or a photoresist.

9. The ion-doped nanomaterial of claim 1, wherein the thickness of the capping layer is in the range from about 100 nm to about 100 μm.

10. A p-n junction comprising a p-doped nanomaterial of claim 1, wherein positive ions are captured and electrons are induced in the two-dimensional nanomaterial, adjacent to an n-doped nanomaterial of claim 1, wherein negative ions are captured and holes are induced in the two-dimensional nanomaterial, forming a p-n junction between the p-doped and n-doped nanomaterials.

11. An electronic device comprising the ion-doped nanomaterial of claim 1.

12. The device of claim 11 which is a diode, transistor, field-effect transistor, tunneling field effect transistor, photovoltaic device, light-emitting diode, or solar cell.

* * * * *